United States Patent
Hsu et al.

(10) Patent No.: US 8,940,597 B2
(45) Date of Patent: Jan. 27, 2015

(54) IN-SITU METAL GATE RECESS PROCESS FOR SELF-ALIGNED CONTACT APPLICATION

(71) Applicant: Taiwan Semiconductor Manufacturing Co., Ltd., Hsin-Chu (TW)

(72) Inventors: Chia-Jung Hsu, Dacheng Township (TW); Gin-Chen Huang, New Taipei (TW); Yi-An Lin, Taipei (TW); Neng-Kuo Chen, Sinshih Township (TW); Sey-Ping Sun, Hsinchu (TW); Clement Hsingjen Wann, Carmel, NY (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/792,258

(22) Filed: Mar. 11, 2013

(65) Prior Publication Data

US 2014/0256124 A1    Sep. 11, 2014

(51) Int. Cl.
*H01L 21/8238*    (2006.01)
*H01L 29/40*    (2006.01)

(52) U.S. Cl.
CPC ................... *H01L 29/401* (2013.01)
USPC ............ 438/199; 438/585; 438/631; 438/700

(58) Field of Classification Search
CPC ......................... H01L 21/7684; H01L 21/3212
USPC ......... 438/633, 645, 692, 697, 631, 199, 585, 438/700
See application file for complete search history.

(56) References Cited

U.S. PATENT DOCUMENTS

| | | | |
|---|---|---|---|
| 2007/0099414 A1* | 5/2007 | Frohberg et al. | 438/618 |
| 2011/0147341 A1 | 6/2011 | Sato et al. | |
| 2011/0207239 A1* | 8/2011 | Daamen et al. | 438/1 |
| 2012/0264279 A1* | 10/2012 | Lu et al. | 438/585 |

\* cited by examiner

*Primary Examiner* — Thanhha Pham
(74) *Attorney, Agent, or Firm* — Duane Morris LLP

(57) ABSTRACT

A method of producing a metal gate structure. The method includes forming a gate structure above a semiconductor substrate and performing one or more chemical metal planarization (CMP) processes to planarize the formed gate structure using a CMP tool. An in situ gate etching process is performed in a CMP cleaner of the CMP tool to form a gate recess. A contact etch stop layer (CESL) can then be deposited in the formed gate recess and one or more CMP processes performed to planarize the CESL.

20 Claims, 6 Drawing Sheets

IN-SITU METAL GATE RECESS PROCESS FOR SELF-ALIGNED CONTACT APPLICATION

BACKGROUND

Complementary metal oxide semiconductor (CMOS) transistors are the building blocks for integrated circuits (ICs). CMOS devices continue to be scaled to smaller sizes with the goals of increasing both device speed and IC density. Exemplary CMOS devices include N-type metal oxide semiconductor (NMOS) and P-type metal oxide semiconductor (PMOS) transistors. A CMOS transistor generally comprises a semiconductor substrate, a channel layer above the semiconductor substrate, a gate oxide layer and a gate stack above the channel layer, and source and drain diffusion regions in the surface of the semiconductor substrate. Contacts are made to the gate stack and to both the source and drain regions of the transistor.

It is often necessary to align structures fabricated at different lithographic stages of IC fabrication. Such structures can be self-aligned, that is, one structure is forced into a specific position relative to another structure for a wide range of lithographically defined positions. For example, the self-aligned implant of a source and drain to a polysilicon gate has been used to achieve submicron precision in the placement of exemplary CMOS devices. In ICs, contact to the source and/or drain of CMOS devices is necessary to incorporate them into functioning circuits. Contact is normally made through an overlying layer of dielectric material. If, however, the contact holes are misaligned with respect to the gate, a short can result.

Conventional lithographic processes, e.g., contact etching processes, include contact etch stop layers and middle etch stop layers. Such conventional processes, however, can result in contact misalignment caused by topography variations in the IC.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1:
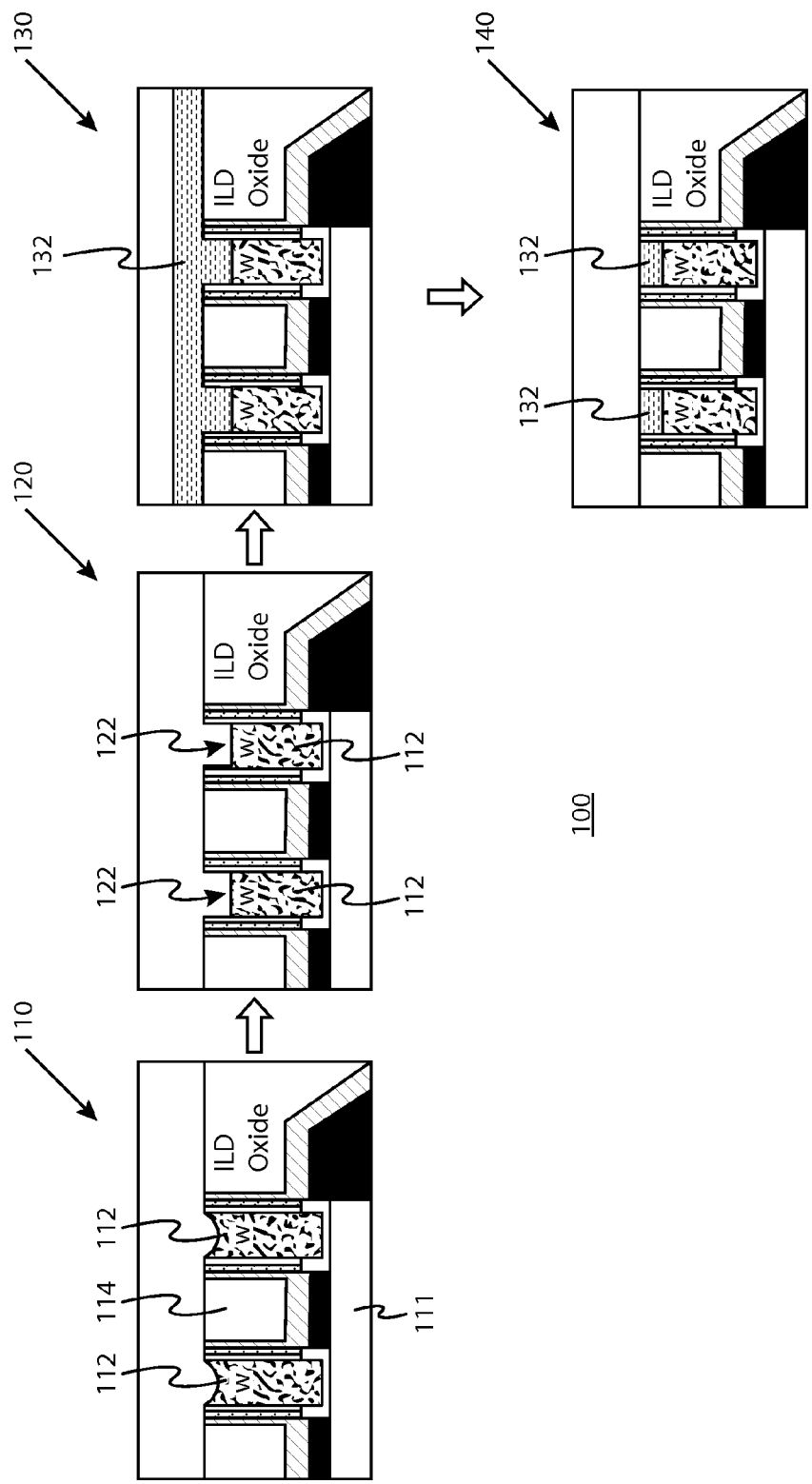
FIG. 1 is a graphical representation of a self-aligned contact process.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

FIG. 1 is a graphical representation of a self-aligned contact process. With reference to FIG. 1, an exemplary self-aligned contact process 100 includes chemical mechanical planarization (CMP) of exemplary contacts formed on a substrate at step 110. CMP is an integral process for smoothing surfaces of semiconductor wafers through both chemical etching and physical abrasion. In an exemplary CMP step, a semiconductor wafer is mounted onto a polishing head which rotates during the CMP process. The polishing head is generally rotated with different axes of rotation to remove material and even out irregular topographies on the wafer. The rotating polishing head presses the semiconductor wafer against a rotating polishing pad. Slurry containing chemical etchants and colloid particles are applied onto the polishing pad, and irregularities on the wafer surface are removed resulting in a planarization of the semiconductor wafer. As depicted, one or more tungsten metal gates 112 are formed on a substrate 111 and subjected to one or more exemplary CMP processes at step 110. It should be understood that the one or more CMP processes encompass any combinations of CMP processes. For example, only one CMP process is used in some embodiments. In other embodiments, the one or more CMP processes include a first and a second. CMP process, and different types of slurry are used in the performing the first and second CMP processes.

The substrate 111 can be a wafer comprising a semiconductor material. Suitable materials for the substrate 111 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Other portions (not shown) of a semiconductor device can be formed on or above the substrate 111. For example, the other portions can include one or more of a buffer layer, an isolator layer or isolation structure such as a shallow trench isolation (STI) structure, a channel layer, a source region and a drain region. While a tungsten metal gate 112 is depicted, any suitable material can be used for the gate including, but not limited to, amorphous silicon, polysilicon, polysilicon/germanium, aluminum, copper, titanium, tantalum, tungsten, molybdenum, platinum, tantalum nitride (TaN), titanium nitride (TN), tungsten nitride (WN), titanium aluminum (TiAl), titanium aluminum nitride (TiAlN), TaCN, TaC, TaSiN, and other conductive materials, and combinations thereof. Further, the conductive material of the gate 112 can be doped or undoped. The gates 112 can be separated from each other by any suitable material or layers. In some embodiments, the gates 112 are separated by an interlayer dielectric (ILD) layer 114. Examples of suitable materials for the ILD layer 114 include, but are not limited to, silicon oxide, silicon oxynitride, phosphosilicate glass (PSG), borophosphosilicate glass (BPSG), other suitable materials, and combinations thereof. The ILD layer 114 can be formed by using chemical vapor deposition (CVD), high density plasma CVD, spin-on, sputtering, or other suitable methods.

At step 120, the tungsten metal gate 112 is subjected to an exemplary etching process. Suitable etching processes include dry etching and wet etching. For example, dry etching is generally the removal of material, e.g., a masked pattern of semiconductor material, through a bombardment of ions (usually a plasma of reactive gases such as fluorocarbons, oxygen, chlorine, etc.) which dislodges portions of the material from the exposed surface. When used in conjunction with photolithographic techniques to attack certain areas of the semiconductor surface, recesses 122 or contact holes can be formed in a respective device. In another embodiment of the present disclosure, wet etching can be used. Exemplary wet etching techniques employ liquid-phase etchants, e.g., phosphoric acid, buffered hydrofluoric acid, or other etchants to chemically remove non-masked layers from the surface of the wafer. Conventionally, contact misalignment occurs between and/or during steps 110 and 120 leading to a short or dysfunctional CMOS device.

At step 130, a contact etch stop layer (CESL) 132 is formed on the wafer and metal contacts. The CESL 132 can be formed from silicon nitride, silicon oxynitride, silicon carbide, silicon oxycarbide, or other suitable materials and combinations thereof. In some embodiments, the CESL 132 is formed of silicon nitride. The CESL 132 can be formed by using CVD, high density plasma CVD, sputtering, or other suitable methods. At step 140, the CESL 132 is subjected to one or more CMP processes to planarize the wafer and remove portions of the CESL 132 outside of the recesses 122.

Figure 2:
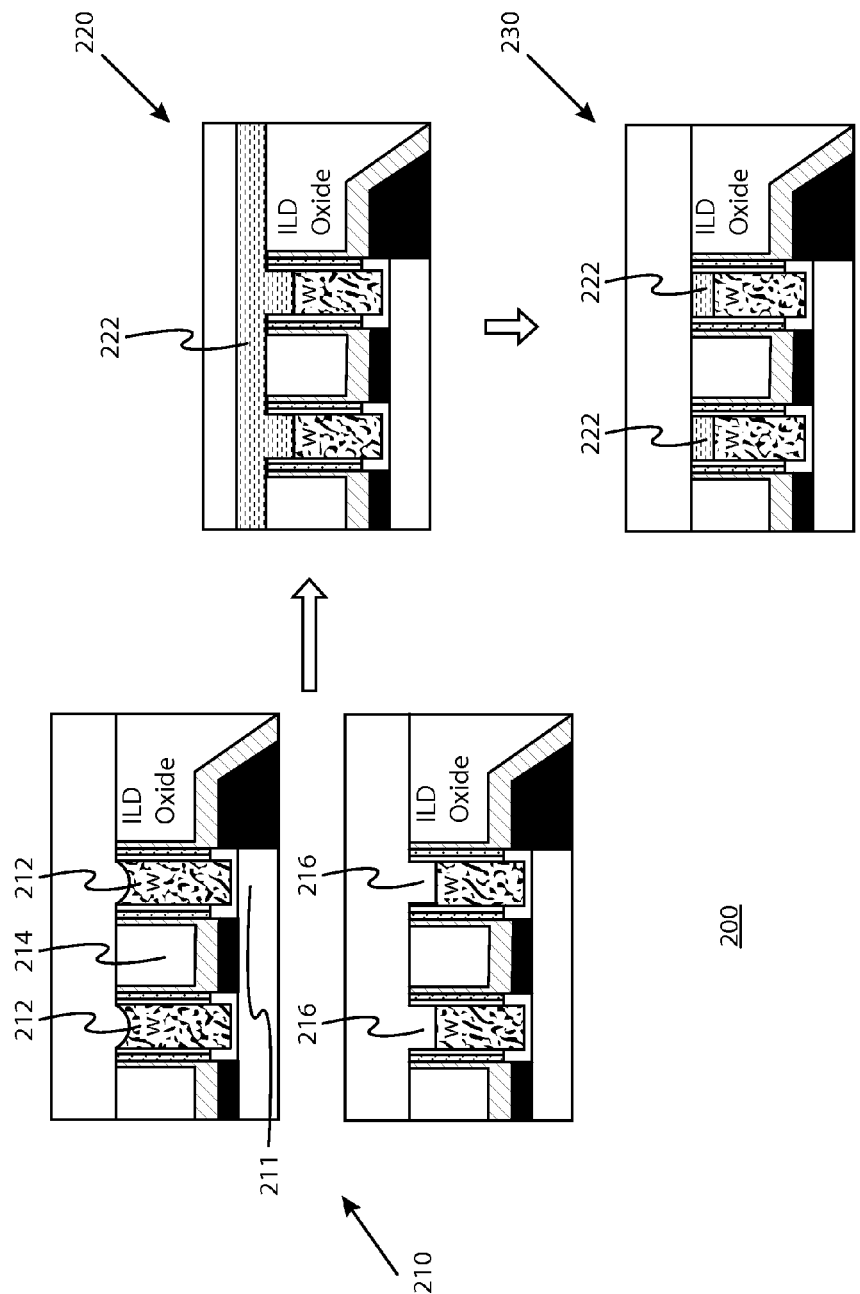
FIG. 2 is a graphical representation of another self-aligned contact process.

FIG. 2 is a graphical representation of another self-aligned contact process. With reference to FIG. 2, an exemplary self-aligned contact process 200 includes CMP of exemplary contacts formed on a substrate at step 210. In an exemplary CMP step, a semiconductor wafer is mounted onto a polishing head which rotates during the CMP process. The polishing head is generally rotated with different axes of rotation to remove material and even out irregular topographies on the wafer. The rotating polishing head presses the semiconductor wafer against a rotating polishing pad. Slurry containing chemical etchants and colloid particles are applied onto the polishing pad, and irregularities on the wafer surface are removed resulting in a planarization of the semiconductor wafer. As depicted, one or more tungsten metal gates 212 are formed on a substrate 211 and subjected to one or more exemplary CMP processes at step 210. It should be understood that the one or more CMP processes encompass any combinations of CMP processes. For example, only one CMP process is used in some embodiments. In other embodiments, the one or more CMP processes include a first and a second CMP process, and different types of slurry are used in the performing the first and second CMP processes. The substrate 211 can be a wafer comprising a semiconductor material. Suitable materials for the substrate 211 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Other portions (not shown) of a semiconductor device can be formed on or above the substrate 211. For example, the other portions can include one or more of a buffer layer, an isolator layer or isolation structure such as a shallow trench isolation (STI) structure, a channel layer, a source region and a drain region. While a tungsten metal gate 212 is depicted, any suitable material can be used for the gate including, but not limited to, amorphous silicon, polysilicon, polysilicon/germanium, Al, Cu, Ti, Ta, W, Mo, Pt, TaN, TiN, WN, TiAl, TiAlN, TaCN, TaC, TaSiN, and other conductive materials and combinations thereof. Further, the conductive material of the gate 212 can be doped or undoped. The gates 212 can be separated from each other by any suitable material or layers. In some embodiments, the gates 212 are separated by an ILD layer 214. Examples of suitable materials for the ILD layer 214 include, but are not limited to, silicon oxide, silicon oxynitride, PSG, BPSG, other suitable materials and combinations thereof, The ILD layer 214 can be formed by using CVD, high density plasma CVD, spin-on, sputtering, or other suitable methods.

To reduce the possibility of misaligned contacts, step 210 includes subjecting the tungsten metal gates 212 to an in-situ gate etching process to replace the dry etching or wet etching step described above. Exemplary in-situ gate etching processes can be used to attack certain areas of the semiconductor surface and form recesses 216 or contact holes in a respective device. At step 220, a CESL 222 is formed on the wafer and metal contacts. The CESL 222 can be formed from silicon nitride, silicon oxynitride, silicon carbide, silicon oxycarbide, or other suitable materials and combinations thereof. In some embodiments, the CESL 222 is formed of silicon nitride. The CESL 222 can be formed by using CVD, high density plasma CVD, sputtering, or other suitable methods. The CESL 222 protects the gate 212 and/or gate insulation and field oxide, if used, from erosion as no contact to the gate 212 is made during subsequent lithographic processes. For example, at step 230, the CESL 222 is subjected to one or more CMP processes to planarize the wafer and remove portions of the CESL 222 outside of the recesses 216. Due to the CESL 222, the gate 212 is protected from the mechanical and chemical stresses associated with CMP or other lithographic techniques.

Figure 3:
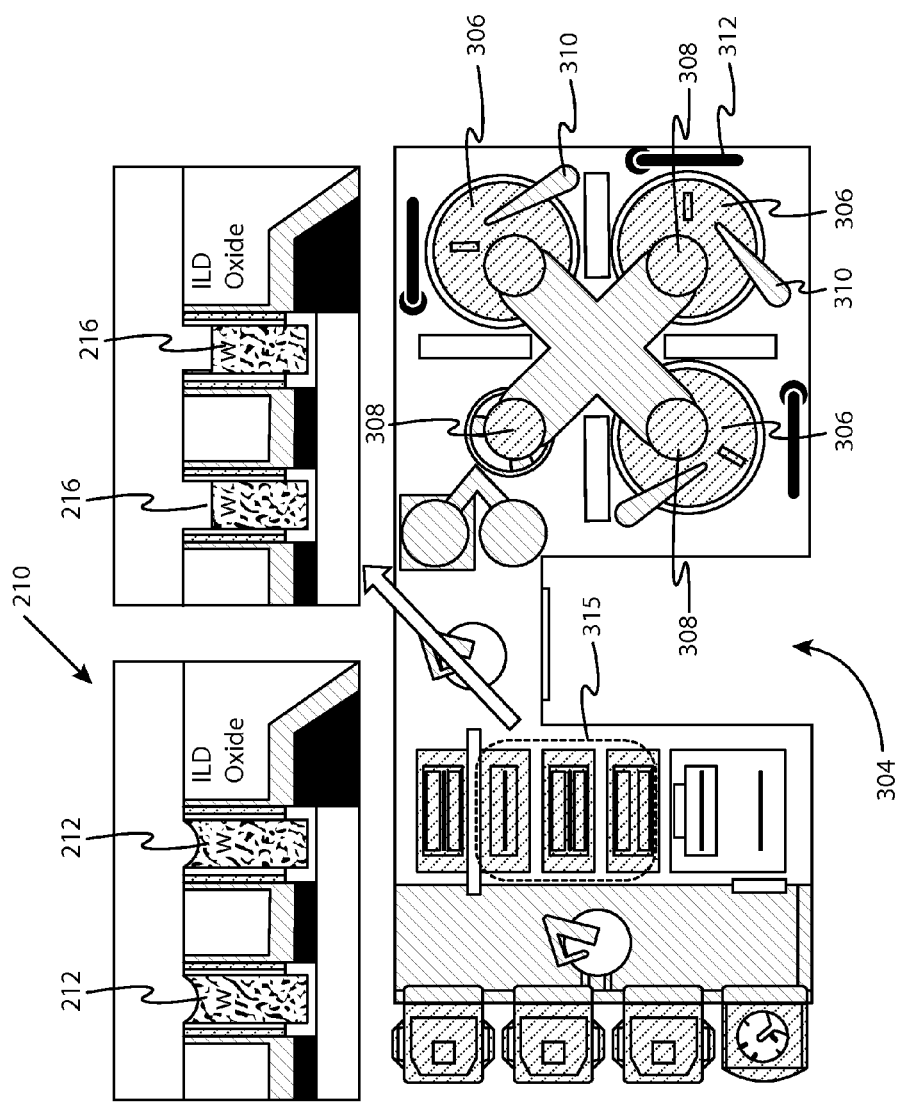
FIG. 3 is a graphical representation of a further self-aligned contact process.

FIG. 3 is a graphical representation of a further self-aligned contact process. With reference to FIG. 3, step 210 illustrated in FIG. 2 is further described graphically. For example, one or more wafers can be subjected to CMP using an exemplary CMP tool or machine 304. An exemplary CMP machine 304 includes one or more rotating platens covered by a pad 306. The wafer being polished is generally mounted upside down is a carrier or spindle 308. The wafer is held by vacuum to the carrier or spindle 308, and a slurry can be introduced on the pad 306 via a slurry introduction mechanism 310. Pad conditioners 312 can also be employed to prepare and condition the surface of the pad 306 during and before CMP processes. The polishing spindle 308 is generally rotated with different axes of rotation to remove material and even out irregular topographies on the wafer. The rotating polishing spindle 308 presses the semiconductor wafer against the rotating polishing pad 306 and slurry containing chemical etchants and colloid particles are introduced using the slurry introduction mechanism 310 onto the polishing pad 306. Through one or more such exemplary CMP processes, irregularities on the wafer surface, including on the metal gate 212, are removed resulting in a planarization of the semiconductor wafer. To reduce the possibility of misaligned contacts, the metal gates 212 are subjected to an in-situ gate etching process at a CMP cleaner 315 to replace the dry etching or wet etching step described with reference to FIG. 1. This in-situ gate etching process can be used to attack certain areas of the semiconductor surface and form gate recesses 216 or contact holes in a respective device. In some embodiments, the in situ gate dry etching process is performed using a transformer coupled plasma (TCP), an inductively coupled plasma (ICP), or other suitable plasma source with a mixture of etchant gases. Other suitable dry etching techniques can be utilized such as reactive ion etching (RIE) and plasma etching. In other embodiments, the in situ gate etching process is performed using an in situ wet etching process. By combining the CMP process step with an in situ gate recess etching process step performed at the respective CMP cleaner 315, cycle time can be improved and the contact etching process enlarged.

In some embodiments, exemplary in site gate recess etching processes can include dry or wet patterning of the metal gates 212 (e.g., tungsten-based metal) as well as cleaning off of the metal gates 212 within an exemplary CMP tool or machine 304. For example, treatment of the metal gates can include employing an etching solution which can be accomplished by a dipping method, spraying method or spin-etching method. Conditions for treatment by dipping cannot be specified for all cases as they conditions generally differ depending upon etchant concentration, film thickness, and the like, but generally the treatment temperature will be between 20 to 80° C. and can also be carried out while applying ultrasonic waves. Etching solutions for exemplary in situ gate recess etching processes can include an etching solution comprising 10-40 mass % hydrogen peroxide, 0.1-15 mass % of an organic acid salt, and water. Exemplary organic acid salts include, but are not limited to, salts of citric acid, formic acid, oxalic acid, acetic acid, tartaric acid, succinic acid, malic acid, maleic acid, malonic acid, glutaric acid, adipic acid. D-glucanic acid, itaconic acid, citraconic acid, mesaconic acid, 2-oxoglutaric acid, trimellitic acid, endothall, glutamic acid, methylsuccinic acid, citramalic acid or the like. In some embodiments, the etching solution can also include 0.005-4.5 mass % ammonia to increase the etching rate of the metal gate 212. In additional embodiments of the present disclosure, to avoid providing a trough of the metal gates 212 during etching processes, larger molecular mass percentages of the aforementioned solution constituents can be employed. Further, in various embodiments of the present disclosure the etching solution can include additional components such as inhibitors, organic solvents, and the like to provide more uniform etching.

Figure 4:
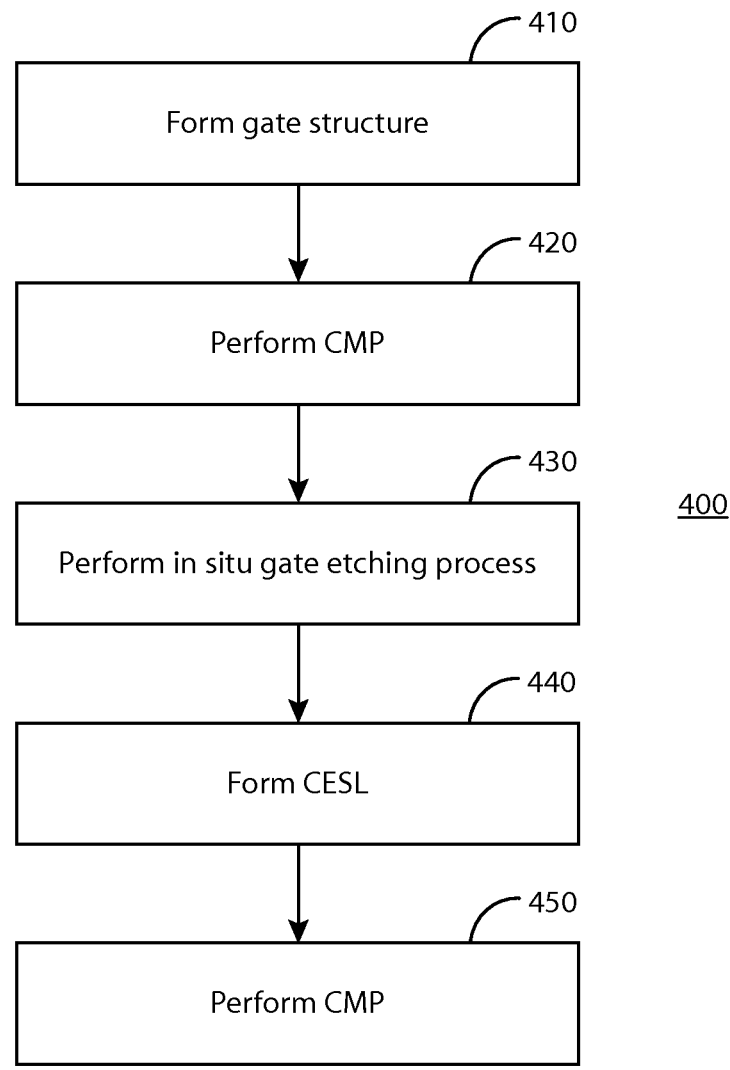
FIG. 4 is a block diagram of some embodiments according to the present disclosure.

FIG. 4 is a block diagram of some embodiments according to the present disclosure. With reference to FIG. 4, a method 400 for producing a metal gate structure is provided. At step 410, a gate structure can be formed above a semiconductor substrate and one or more CMP processes performed at step 420 to planarize the formed gate structure using a CMP tool. The gate structure can be formed from amorphous silicon, polysilicon, polysilicon/germanium, aluminum, copper, titanium, tantalum, tungsten, molybdenum, platinum, tantalum nitride, titanium nitride, tungsten nitride, titanium aluminum, titanium aluminum nitride, TaCN, TaC, TaSiN, or other suitable materials. At step 430, an in situ gate etching process is performed to form a gate recess and at step 440 a CESL is formed in the gate recess. In some embodiments of the present disclosure, step 430 is performed in a CMP cleaner of the CMP tool. In other embodiments, step 430 further comprises forming a gate recess using a bombardment of ions to dislodge portions of the gate structure from an exposed surface thereof. In additional embodiments, step 430 further comprises forming a gate recess by subjecting an exposed surface of the gate structure to a liquid chemical etchant. Exemplary liquid chemical etchants and mass percentages components thereof are described above. The CESL formed in step 440 can be formed from silicon nitride, silicon oxynitride, silicon carbide, silicon oxycarbide, and other suitable materials. In some embodiments, step 440 is performed using chemical vapor deposition, high density plasma chemical vapor deposition, or sputtering. At step 450 one or more CMP processes can be performed to planarize the CESL.

Figure 5:
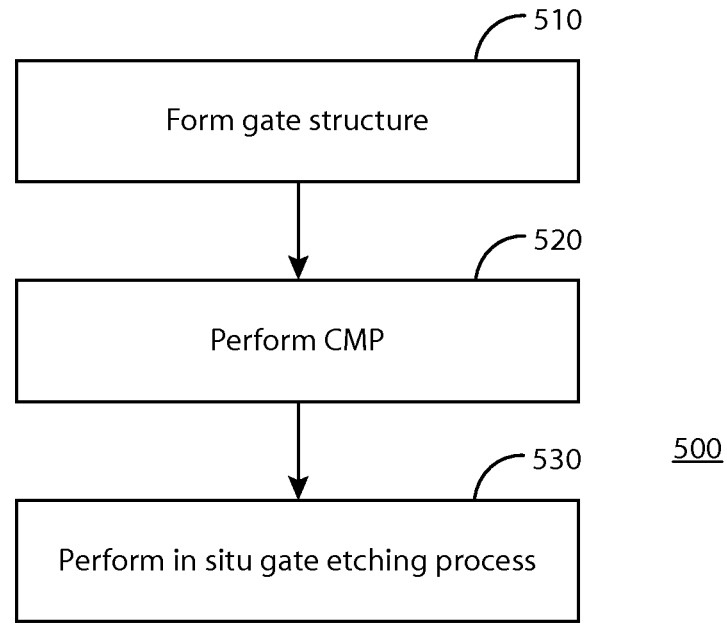
FIG. 5 is a block diagram of additional embodiments according to the present disclosure.

FIG. 5 is a block diagram of additional embodiments according to the present disclosure. With reference to FIG. 5, a method 500 for producing a metal gate structure is provided. At step 510, a gate structure can be formed above a semiconductor substrate. At step 520, one or more CMP processes can be performed to planarize the formed gate structure using a CMP tool. The gate structure can be formed from amorphous silicon, polysilicon, polysilicon/germanium, aluminum, copper, titanium, tantalum, tungsten, molybdenum, platinum, tantalum nitride, titanium nitride, tungsten nitride, titanium aluminum, titanium aluminum nitride, TaCN, TaC, TaSiN, or other suitable materials. At step 530, an in situ gate etching process is performed in a CMP cleaner of the CMP tool to form a gate recess. In some embodiments of the present disclosure, the method 500 includes forming a CESL in the gate recess and performing one or more CMP processes to planarize the CESL by exemplary processes such as chemical vapor deposition, high density plasma chemical vapor deposition, or sputtering. The CESL formed in these embodiments can be formed from silicon nitride, silicon oxynitride, silicon carbide, silicon oxycarbide, and other suitable materials. In some embodiments, step 530 further comprises forming a gate recess using a bombardment of ions to dislodge portions of the gate structure from an exposed surface thereof. In additional embodiments, step 530 further comprises forming a gate recess by subjecting an exposed surface of the gate structure to a liquid chemical etchant. Exemplary liquid chemical etchants and mass percentages components thereof are described above.

Figure 6:
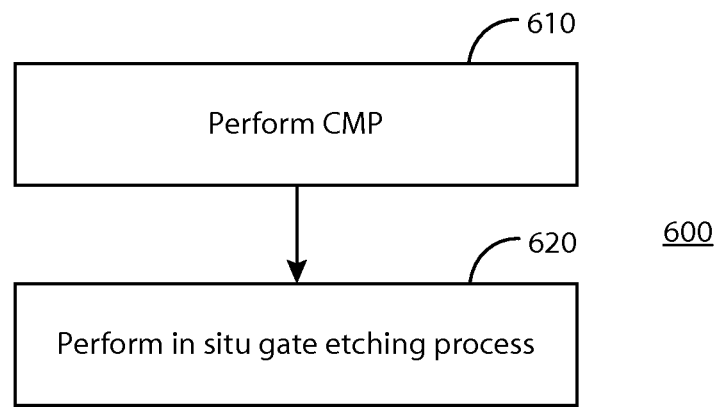
FIG. 6 is a block diagram of various embodiments according to the present disclosure.

FIG. 6 is a block diagram of various embodiments according to the present disclosure. With reference to FIG. 6, a method 600 for producing a metal gate structure is provided. At step 610, one or more CMP processes is performed using a CMP tool to planarize a gate structure overlying a substrate. At step 620, an in situ etching process is performed in a CMP cleaner of the CMP tool to form a gate recess for the planarized gate structure. The gate structure can be formed from amorphous silicon, polysilicon, polysilicon/germanium, aluminum, copper, titanium, tantalum, tungsten, molybdenum, platinum, tantalum nitride, titanium nitride, tungsten nitride, titanium aluminum, titanium aluminum nitride, TaCN, TaC, TaSiN, or other suitable materials. In some embodiments, step 620 further comprises forming a gate recess using a bombardment of ions to dislodge portions of the gate structure from an exposed surface thereof. In additional embodiments, step 620 further comprises forming a gate recess by subjecting an exposed surface of the gate structure to a liquid chemical etchant. Exemplary liquid chemical etchants and mass percentages components thereof are described above.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-6, various in-situ metal gate processes for self-aligned contact applications have been described While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method of producing a metal gate structure comprising the steps of:
   forming a gate structure above a semiconductor substrate;
   performing one or more chemical metal planarization (CMP) processes to planarize the formed gate structure using a CMP tool;
   performing an in situ gate etching process by subjecting an exposed surface of the gate structure to a liquid chemical etchant to form a gate recess, wherein the liquid chemical etchant includes hydrogen peroxide and an organic acid salt;
   forming a contact etch stop layer (CESL) in the formed gate recess; and
   performing one or more CMP processes to planarize the CESL.

2. The method of claim 1 wherein the gate structure is formed from a material selected from the group consisting of amorphous silicon, polysilicon, polysilicon/germanium, aluminum, copper, titanium, tantalum, tungsten, molybdenum, platinum, tantalum nitride, titanium nitride, tungsten nitride, titanium aluminum, titanium aluminum nitride, TaCN, TaC, TaSiN, and combinations thereof.

3. The method of claim 1 wherein the in situ etching process is performed in a CMP cleaner of the CMP tool.

4. The method of claim 1 wherein the step of performing an in situ gate etching process further comprises forming a gate recess using a bombardment of ions to dislodge portions of the gate structure from an exposed surface thereof.

5. The method of claim 1 wherein the organic acid salt is selected from the group consisting of salts of citric acid, formic acid, oxalic acid, acetic acid, tartaric acid, succinic acid, malic acid, maleic acid, malonic acid, glutaric acid, adipic acid, D-glucanic acid, itaconic acid, citraconic acid, mesaconic acid, 2-oxoglutaric acid, trimellitic acid, endothall, glutamic acid, methylsuccinic acid, and citramalic acid.

6. The method of claim 1 wherein the liquid chemical etchant further comprises a ammonia or an inhibitor.

7. The method of claim 6, wherein the etching solution comprises 0.005-4.5 mass percent ammonia.

8. The method of claim 1 wherein the step of forming a CESL is performed using chemical vapor deposition, high density plasma chemical vapor deposition, or sputtering.

9. The method of claim 1, wherein the etching solution comprises 10-40 mass percent hydrogen peroxide and 0.1-15 mass percent organic acid salt.

10. A method of producing a metal gate structure comprising the steps of:
    forming a gate structure above a semiconductor substrate;
    performing one or more chemical metal planarization (CMP) processes to planarize the formed gate structure using a CMP tool; and
    performing an in situ gate etching process in a CMP cleaner of the CMP tool to form a gate recess, the in situ gate etching process comprising forming a gate recess by subjecting an exposed surface of the gate structure to a liquid chemical etchant, wherein the liquid chemical etchant comprises hydrogen peroxide and an organic acid salt.

11. The method of claim 10 further comprising the steps of:
    forming a contact etch stop layer (CESL) in the formed gate recess; and
    performing one or more CMP processes to planarize the CESL.

12. The method of claim 11 wherein the step of forming a CESL is performed using chemical vapor deposition, high density plasma chemical vapor deposition, or sputtering.

13. The method of claim 10 wherein the gate structure is formed from a material selected from the group consisting of amorphous silicon, polysilicon, polysilicon/germanium, aluminum, copper, titanium, tantalum, tungsten, molybdenum, platinum, tantalum nitride, titanium nitride, tungsten nitride, titanium aluminum, titanium aluminum nitride, TaCN, TaC, TaSiN, and combinations thereof.

14. The method of claim 10 wherein the step of performing an in situ etching process further comprises forming a gate recess using a bombardment of ions to dislodge portions of the gate structure from an exposed surface thereof.

15. The method of claim 10 wherein the organic acid salt is selected from the group consisting of salts of citric acid, formic acid, oxalic acid, acetic acid, tartaric acid, succinic acid, malic acid, maleic acid, malonic acid, glutaric acid, adipic acid, D-glucanic acid, itaconic acid, citraconic acid, mesaconic acid, 2-oxoglutaric acid, trimellitic acid, endothall, glutamic acid, methylsuccinic acid, and citramalic acid.

16. The method of claim 10 wherein the liquid chemical etchant further comprises a ammonia or an inhibitor.

17. The method of claim 16, wherein the etching solution comprises 0.005-4.5 mass percent ammonia.

18. The method of claim 10, wherein the etching solution comprises 10-40 mass percent hydrogen peroxide and 0.1-15 mass percent organic acid salt.

19. A method of producing a metal gate structure comprising the steps of:

performing one or more chemical metal planarization (CMP) processes using a CMP tool to planarize a gate structure overlying a substrate; and performing an in situ etching process in a CMP cleaner of the CMP tool to form a gate recess for the planarized gate structure, the in situ gate etching process comprising forming a gate recess by subjecting an exposed surface of the gate structure to a liquid chemical etchant, wherein the liquid chemical etchant comprises hydrogen peroxide and an organic acid salt.

20. The method of claim 19, wherein the etching solution comprises 10-40 mass percent hydrogen peroxide and 0.1-15 mass percent organic acid salt.

* * * * *